(12) United States Patent
Yu et al.

(10) Patent No.: US 9,230,999 B2
(45) Date of Patent: Jan. 5, 2016

(54) PIXEL SUBSTRATE AND FABRICATION METHOD THEREOF

(71) Applicant: HannStar Display Corporation, Taipei (TW)

(72) Inventors: Chia-Hua Yu, New Taipei (TW); Mu-Kai Kang, Pingtung County (TW); Hsien-Tang Hu, Taichung (TW); Chang-Ming Chao, Taichung (TW); Jui-Chi Lai, Kaohsiung (TW)

(73) Assignee: HannStar Display Corporation, Taipei (TW)

( * ) Notice: Subject to any disclaimer, the term of this patent is extended or adjusted under 35 U.S.C. 154(b) by 0 days.

(21) Appl. No.: 14/590,001

(22) Filed: Jan. 6, 2015

(65) Prior Publication Data

US 2015/0194449 A1    Jul. 9, 2015

(30) Foreign Application Priority Data

Jan. 6, 2014    (CN) .......................... 2014 1 0008757

(51) Int. Cl.
| | |
|---|---|
| *H01L 27/12* | (2006.01) |
| *H01L 21/321* | (2006.01) |
| *H01L 21/336* | (2006.01) |
| *H01L 29/786* | (2006.01) |

(52) U.S. Cl.
CPC .......... *H01L 27/1248* (2013.01); *H01L 21/321* (2013.01); *H01L 27/1259* (2013.01); *H01L 29/78606* (2013.01)

(58) Field of Classification Search
None
See application file for complete search history.

(56) References Cited

U.S. PATENT DOCUMENTS

| 7,580,088 | B2 * | 8/2009 | Kim et al. .................... 349/43 |
| 8,669,600 | B2 * | 3/2014 | Park et al. .................... 257/288 |
| 2009/0108259 | A1 * | 4/2009 | Lin et al. .................... 257/59 |
| 2012/0184060 | A1 * | 7/2012 | Song et al. .................... 438/34 |
| 2015/0028300 | A1 * | 1/2015 | Kim et al. .................... 257/40 |
| 2015/0187817 | A1 * | 7/2015 | Kim et al. .................... 257/40 |

* cited by examiner

*Primary Examiner* — Joseph Schoenholtz
(74) *Attorney, Agent, or Firm* — Jianq Chyun IP Office

(57) ABSTRACT

A pixel substrate and a fabrication method thereof are provided. The method includes: forming a gate and a lower pad on a substrate; forming a gate insulating layer overlaying the gate and the lower pad; forming a channel layer and a first electrode layer on the gate insulating layer, in which the projection areas of the channel layer and the gate on the substrate are overlapped; forming an etching-barrier material layer on the substrate and simultaneously forming a contact opening at the gate insulating layer to expose the lower pad; forming a source, a drain and an upper pad on the substrate; forming a protective layer; forming a second electrode layer with multiple slits on the protective layer, in which one of the first and second electrode layers is electrically connected to the drain. The invention can simplify the process steps and reduce fabrication time.

20 Claims, 16 Drawing Sheets

PIXEL SUBSTRATE AND FABRICATION METHOD THEREOF

CROSS-REFERENCE TO RELATED APPLICATION

This application claims the priority benefit of Chinese application serial no. 201410008757.5, filed on Jan. 6, 2014. The entirety of the above-mentioned patent application is hereby incorporated by reference herein and made a part of this specification.

BACKGROUND OF THE INVENTION

1. Field of the Invention

The invention generally relates to a substrate and a fabrication method thereof, and more particularly, to a pixel substrate and a fabrication method thereof.

2. Description of Related Art

In recent years, along with the development of display technology, the requirements on the displayed image quality of displays from the consumer community have become increasingly demanding. In order to increase the display quality of an LCD (liquid crystal display), various display techniques on the current market have been launched, such as in-plane switching (IPS) LCD, multi-domain vertically alignment (MVA) LCD and fringe field switching (FFS) LCD.

Taking the FFS LCD as an example, because of its wide viewing angle, fast response and accurate color reproduction characteristics, it has been widely used in various display products. However, for the existing pixel structure of an FFS display, it needs eight mask processes for fabrication, which is considerable time-consuming and costs high.

SUMMARY OF THE INVENTION

Accordingly, the invention is directed to a pixel substrate and a fabrication method thereof which can simplify the fabrication steps and reduce production time.

The invention provides a fabrication method of a pixel substrate, which includes: forming a channel layer and a first electrode layer on an insulating layer, in which both the channel layer and the first electrode layer are located in the pixel region of a substrate; forming an etching-barrier material layer on the substrate to entirely overlay the channel layer, the first electrode layer and the insulating layer; performing an etching step for patterning the etching-barrier material layer to form an etching-barrier pattern layer, in which the etching-barrier pattern layer has a first contact opening exposing a non-shielded portion of the insulating layer, wherein subsequent to forming the etching-barrier material layer, the etching step further removes removing the non-shielded portion of the insulating layer to form a second contact opening at the insulating layer; forming a source, a drain and an upper pad on the substrate; forming a protective layer on the substrate to overlay the source, the drain and the upper pad; and forming a second electrode layer on the protective layer, in which the second electrode layer is located in the pixel region and has a plurality of slits, and the projection area of the second electrode layer on the substrate and the projection area of the first electrode layer on the substrate are overlapped with each other.

The invention also provides a pixel substrate, which includes: a channel layer disposed on an insulating layer and located at a pixel region of a substrate; a first electrode layer located in the pixel region; an etching-barrier pattern layer including a pixel region pattern and a peripheral circuit region pattern, in which the pixel region pattern exposes a first contact region and a second contact region of the channel layer, and the peripheral circuit region pattern has a first contact opening located at a peripheral circuit region of the substrate and the insulating layer includes a second contact opening communicated with the first contact opening; a source and a drain; an upper pad filled in the first contact opening and the second contact opening; and a second electrode layer located in the pixel region and having a plurality of slits, in which the projection area of the second electrode layer on the substrate and the projection area of the first electrode layer on the substrate are overlapped with each other, in which one of the first electrode layer and the second electrode layer is electrically connected to the drain, while the other one is connected to a common electric-potential.

Based on the depiction above, in the fabrication method of a pixel substrate of the embodiment of the invention, after patterning the etching-barrier material layer, the portion of the gate insulating layer not shielded by the channel layer, the first electrode layer and the etching-barrier pattern layer is removed, which means the openings of the etching-barrier material layer and the openings of the gate insulating layer are fabricated by performing one same patterning step, which can reduce the number of times of performing the patterning steps for fabricating the pixel structure so as to reduce the fabrication time, and the pixel substrate can be fabricated by using the fabrication method provided by the invention.

In order to make the features and advantages of the present invention more comprehensible, the present invention is further described in detail in the following with reference to the embodiments and the accompanying drawings.

DESCRIPTION OF THE EMBODIMENTS

Figure 1A:
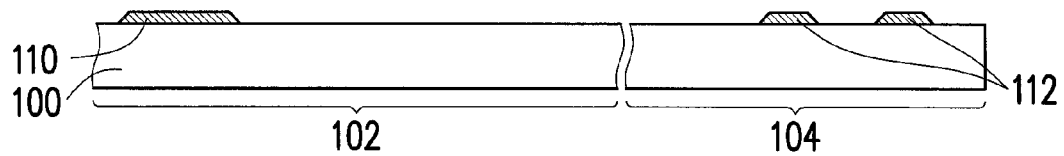
FIGS. 1A through 1I are schematic diagrams of the fabrication flow of a pixel substrate according to the first embodiment of the invention.

FIGS. 1A through 1I are schematic diagrams of the fabrication flow of a pixel substrate according to the first embodiment of the invention. Referring to FIG. 1A, first, a substrate 100 is provided. In general, the substrate 100 can be divided into a pixel region 102 and a peripheral circuit region 104, in which the peripheral circuit region 104 is adjacent to the pixel region 102. At the time, a first mask process is used to simultaneously form a gate 110 in the pixel region 102 and a lower pad 112 in the peripheral circuit region 104 on the substrate 100. The material of the gate 110 and the lower pad 112 includes single-layer or multi-layer stacked metal material such as molybdenum (Mo) or aluminum/molybdenum (Al/Mo). So-called mask process is a step to pattern a material layer by using a mask. For example, the first mask process includes: forming an entire material layer (for example, a metal material layer) on the substrate 100; forming a patterned photoresist on the material layer by using the first mask; and etching the material layer under the shielding of the patterned photoresist so as to pattern the material layer, which the invention is not limited to.

Figure 1B:
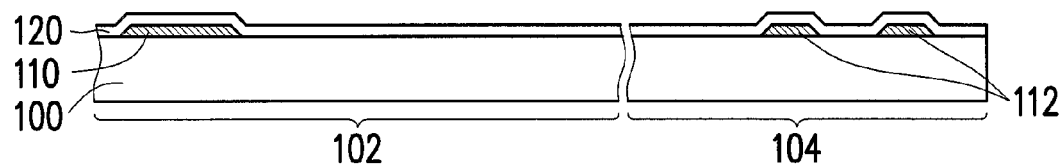
Figure 1C:
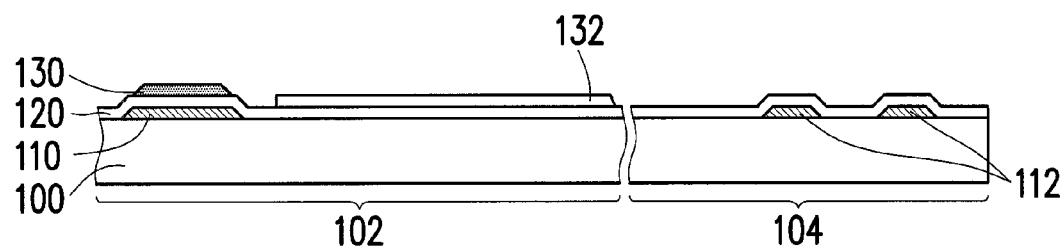

Referring to FIG. 1B, after finishing the gate 110 and the lower pad 112, a gate insulating layer 120 is formed on the substrate 100. The gate insulating layer 120 overlays the gate 110 and the lower pad 112, in which the material of the gate insulating layer 120 includes inorganic dielectric material, such as silicon oxide, silicon nitride or combinations thereof. Then as shown in FIG. 1C, a second mask process and a third mask process are performed to respectively form the channel layer 130 and the first electrode layer 132 on the gate insulating layer 120. In more details, both the channel layer 130 and the first electrode layer 132 are located in the pixel region 102, and the projection area of the channel layer 130 on the substrate 100 and the projection area of the gate 110 on the substrate 100 are overlapped with each other. In the embodiment, the material of the channel layer 130 includes oxide semiconductor material, for example, indium-gallium-zinc oxide (IGZO), which the invention is not limited to. The material of the channel layer 130 can also be other crystalline or non-crystalline semiconductor material, such as crystalline silicon, polysilicon, amorphous silicon, or the like. The material of the first electrode layer 132 can include a transparent conductive material, such as indium-tin oxide (ITO), which the invention is not limited to. At the time, when the materials of the channel layer 130 and the first electrode layer 132 are different from each other, they can be fabricated with different mask process, while when the materials of the channel layer 130 and the first electrode layer 132 are the same, they can be fabricated with a same mask process, which is helpful to simplify the process flow and reduce the fabrication time.

Figure 1D:
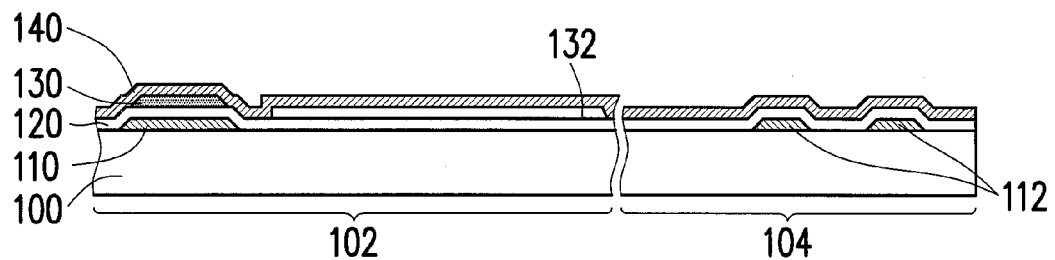
Figure 1E:
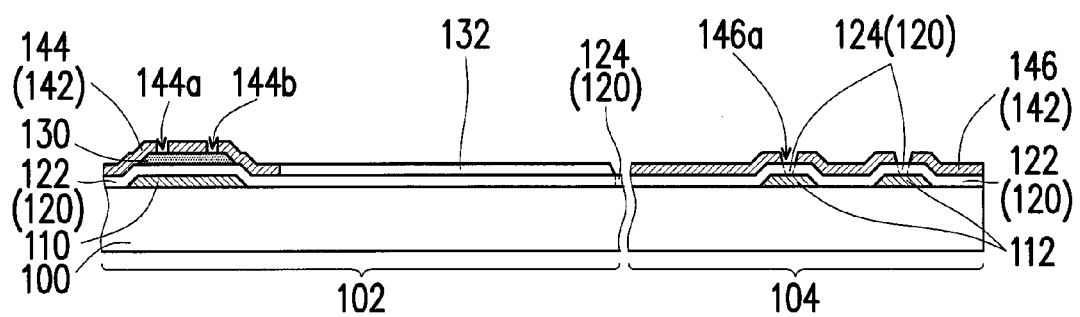

As shown by FIG. 1D, after finishing the gate insulating layer 120, the channel layer 130 and the first electrode layer 132, an etching-barrier material layer 140 is subsequently formed on the substrate 100. The etching-barrier material layer 140 entirely overlays the channel layer 130, the first electrode layer 132 and the gate insulating layer 120. Further, as shown in FIG. 1E, a fourth mask process is performed to pattern the etching-barrier material layer to form an etching-barrier pattern layer 142. At the time, the etching-barrier pattern layer 142 includes a pixel region pattern 144 and a peripheral circuit region pattern 146, and the etching-barrier pattern layer 142 exposes the first electrode layer 132. In the embodiment, the material of the etching-barrier material layer 140 includes oxide material, such as silicon oxide, which the invention is not limited to.

Figure 1F:
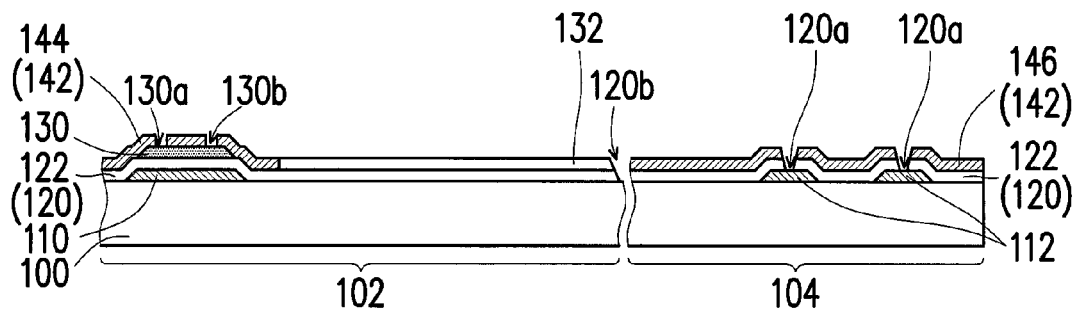

In more details, referring to FIGS. 1E and 1F, the pixel region pattern 144 has a first channel contact opening 144a and a second channel contact opening 144b, wherein the first channel contact opening 144a exposes a first contact region 130a of the channel layer 130 and the second channel contact opening 144b exposes a second contact region 130b of the channel layer 130. The pixel region pattern 144 substantially overlays the area of the portion of the channel layer 130 excluding the first contact region 130a and the second contact region 130b. In addition, the peripheral circuit region pattern 146 has a first contact opening 146a, and each of the first contact openings 146a is located over one of the lower pads 112.

In FIG. 1E, the gate insulating layer 120 can also include a shielded portion 122 and a non-shielded portion 124. The shielded portion 122 is shield by the channel layer 130, the first electrode layer 132 and the etching-barrier pattern layer 142, while the non-shielded portion 124 is not shield by them. In FIG. 1F, the non-shielded portion 124 of the gate insulating layer 120 is removed by using an etching process, wherein the etching process is, for example, a dry etching process, which the invention is not limited to. In this way, the second contact openings 120a are formed at the gate insulating layer 120, and each of the second contact openings 120a is communicated with a corresponding first contact opening 146a and exposes one of the lower pads 112.

It should be noted that the etching steps in FIGS. 1E and 1F can be performed continuously without using additional masks, which is helpful to reduce the number of times of performing the mask process and reduce the fabrication time. In addition, during forming the etching-barrier material layer 140, the film thickness of the etching-barrier material layer 140 can be less than the film thickness of the gate insulating layer 120 by setting, so that during the process of patterning the etching-barrier material layer 140, the non-shielded portion 124 of the gate insulating layer 120 can be further removed, i.e., the etching-barrier pattern layer 142 and the gate insulating layer 120 with the desired patterns in the embodiment can be fabricated with a same mask.

Figure 1G:
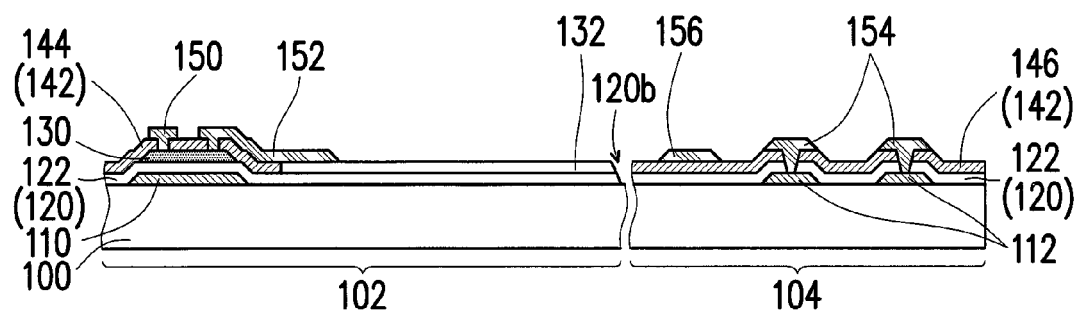

Referring to FIGS. 1F and 1G, after finishing the step of patterning the etching-barrier material layer 140 and the gate insulating layer 120 to expose the first electrode layer 132 and the lower pad 112, a fifth mask process is performed to form a source 150, a drain 152 and a upper pad 154 on the substrate 100. The material of the source 150, the drain 152 and the upper pad 154 includes single-layer or multi-layer stacked metal material such as molybdenum (Mo) or molybdenum/aluminum/molybdenum (Mo/Al/Mo). Specifically, the source 150 and the drain 152 respectively contact the first contact region 130a and the second contact region 130b of the channel layer 130, and the drain 152 can be made to directly contact and electrically connect the first electrode layer 132. In addition, the upper pad 154 is located over the lower pad 112 and contacts the lower pad 112 via the first contact opening 146a and the second contact opening 120a. In the embodiment, during forming the upper pad 154, a signal pad 156 can also be fabricated on the peripheral circuit region pattern 146 of the etching-barrier pattern layer 142.

Figures 1H, 1I:
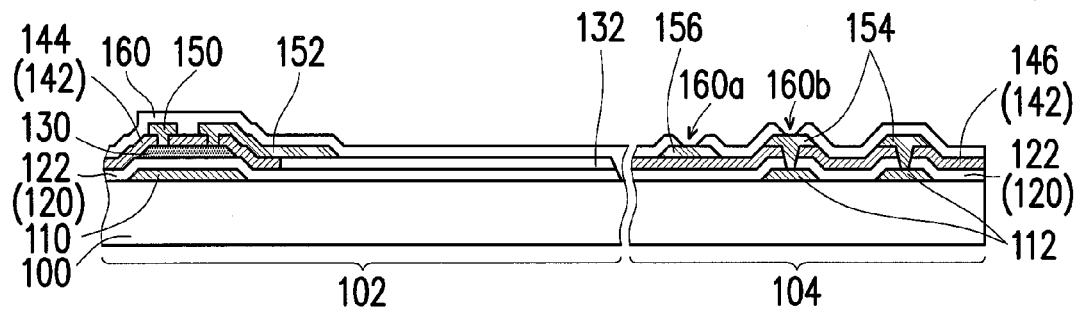

Then, referring to FIG. 1H, after finishing the source 150, the drain 152, the upper pad 154 and the signal pad 156, a protective layer 160 is formed on the substrate 100. The protective layer 160 overlays the source 150, the drain 152, the upper pad 154 and the signal pad 156 for the protection and isolation purpose. In addition, in order to make the signal pad 156 electrically connected to one of the upper pads 154, a sixth mask process is used to respectively form a third contact opening 160a and a fourth contact opening 160b in the protective layer 160, wherein the third contact opening 160a exposes the signal pad 156 and the fourth contact opening 160b exposes the corresponding upper pad 154.

Referring to FIG. 1I, after forming the protective layer 160 on the substrate 100, a seventh mask process is performed to form a second electrode layer 170 and a connection electrode 172 on the protective layer 160. The second electrode layer 170 is located in the pixel region 102 and has a plurality of slits 170a, 170b and 170c, and the projection area of the second electrode layer 170 on the substrate 100 and the projection area of the first electrode layer 132 on the substrate 100 are overlapped with each other. The areas of the slits 170a, 170b and 170c are overlapped with the area of the first electrode layer 132. When different voltages are applied to the first electrode layer 132 and the second electrode layer 170, the fringe field effect can be produced at the edges of the slits 170a, 170b and 170c so that the fringe field switching pixel design is implemented.

In addition, the connection electrode 172 can contact the signal pad 156 and the corresponding upper pad 154 via the third contact opening 160a and the fourth contact opening 160b, so that the upper pad 154 and the signal pad 156 are electrically connected to each other through the connection electrode 172.

According to the aforementioned steps of the embodiment, a pixel structure is formed at the pixel region 102 on the substrate 100, and meanwhile, the desired pad structure is fabricated at the peripheral circuit region 104 on the substrate 100, which makes different conductive layers electrically connected to each other, for example, makes one of the lower pads 112 and the signal pad 156 electrically connected to each other. It should be noted that according to the layout of the pixel structure in the embodiment, the first electrode layer 132 is connected to the drain 152, while the second electrode layer 170 can be connected to a common electric-potential to produce the desired fringe field, which the invention is not limited to. In the second embodiment, the second electrode layer is connected to the drain as the setting and the first electrode layer is connected to the common electric-potential. Thus, the invention does not specifically limit which one of the first electrode layer and the second electrode layer is connected to the drain.

For example, FIGS. 2A through 2I are schematic diagrams of the fabrication flow of a pixel substrate according to the second embodiment of the invention. The fabrication method of a pixel substrate of FIGS. 2A-2C in the embodiment is similar to the method of FIGS. 1A-1C, wherein the same portions in the two embodiments are represented in the same notations so as to omit the description thereof. The major difference of the embodiment of FIGS. 2D-2I from the embodiment of FIGS. 1D-1I is given in the following depiction.

Figure 2A:
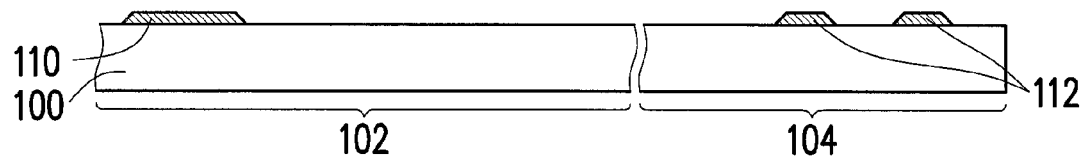
FIGS. 2A through 2I are schematic diagrams of the fabrication flow of a pixel substrate according to the second embodiment of the invention.
Figure 2B:
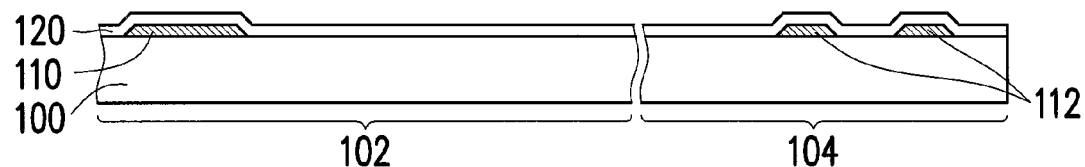
Figure 2C:
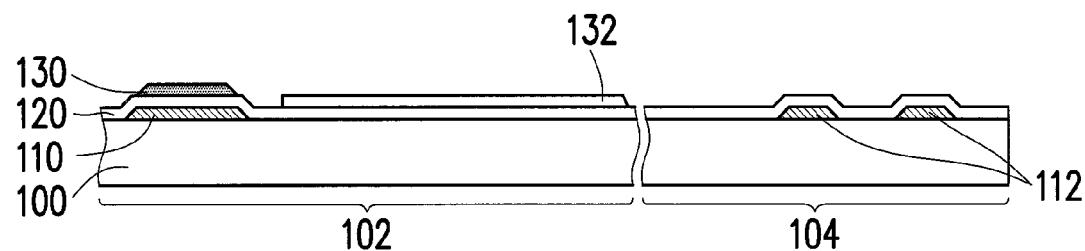
Figure 2D:
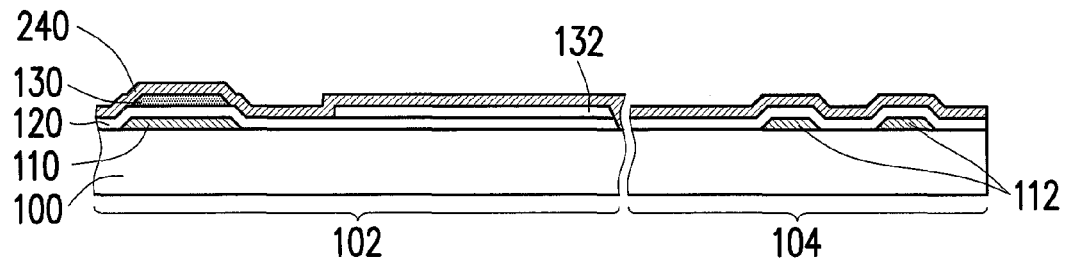
Figure 2E:
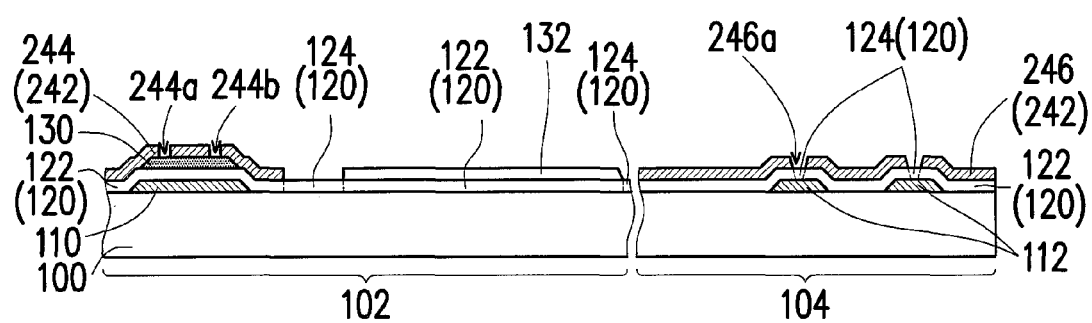

In more details, as shown in FIG. 2D, after finishing the aforementioned gate insulating layer 120, channel layer 130 and first electrode layer 132, an etching-barrier material layer 240 is formed on the substrate 100. The etching-bather material layer 240 entirely overlaps the channel layer 130, the first electrode layer 132 and the gate insulating layer 120. Then, as shown in FIG. 2E, a fourth mask process is performed to pattern the etching-barrier material layer to form an etching-bather pattern layer 242. The etching-bather pattern layer 242 includes a pixel region pattern 244 and a peripheral circuit region pattern 246, and is separated from the first electrode layer 132. In the embodiment, the material of the etching-bather material layer 240 includes oxide material, such as silicon oxide, which the invention is not limited to.

Figure 2F:
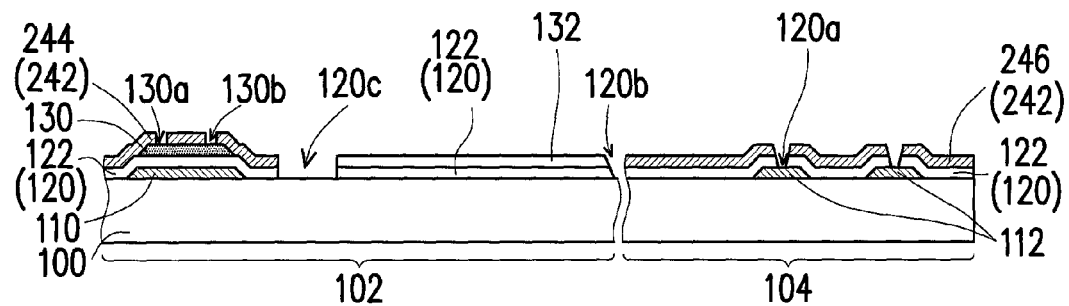

Referring to FIGS. 2E and 2F, the pixel region pattern 244 has a first channel contact opening 244a and a second channel contact opening 244b, wherein the first channel contact opening 244a exposes a first contact region 130a of the channel layer 130 and the second channel contact opening 244b exposes a second contact region 130b of the channel layer 130. The pixel region pattern 244 overlays the portion of the channel layer 130 excluding the first contact region 130a and the second contact region 130b. In addition, the peripheral circuit region pattern 246 has a first contact opening 246a, and each of the first contact openings 246a is located over one of the lower pads 112.

Figure 2G:
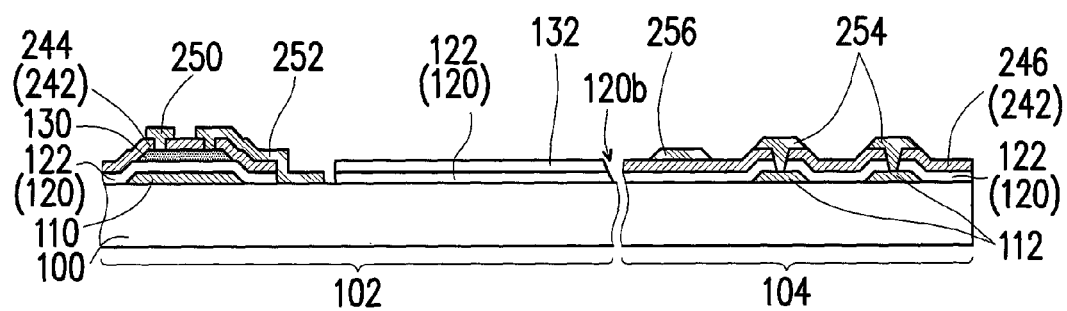

In addition, in the embodiment, the pixel region pattern 244 is separated from the first electrode layer 132 by a distance. Meanwhile, none of the channel layer 130, the first electrode layer 132 and the etching-barrier pattern layer 242 is disposed on a partial area between the pixel region 102 and the peripheral circuit region 104. Thus, the gate insulating layer 120 includes a shielded portion 122 and a non-shielded portion 124. The shielded portion 122 is shielded by at least one of the channel layer 130, the first electrode layer 132 and the etching-barrier pattern layer 242, while the non-shielded portion 124 is not shield by them. As shown by FIG. 2F, the non-shielded portion 124 of the gate insulating layer 120 in the embodiment is removed by using an etching process, wherein the etching process is, for example, a dry etching process, which the invention is not limited to. In this way, the second contact openings 120a are formed at the gate insulating layer 120, and the second contact openings 120a are communicated with the first contact openings 246a and expose the lower pads 112. During removing the non-shielded portion 124 of the gate insulating layer 120, at least one of openings 120b and 120c is also formed in the gate insulating layer 120 to expose the substrate 100. The opening 120b is located between the pixel region 102 and the peripheral circuit region 104, while the opening 120c is located between the pixel region pattern 244 and the first electrode layer 132. Referring to FIGS. 2F and 2G, after finishing the step of patterning the etching-barrier material layer 240 and the gate insulating layer 120 to expose the first electrode layer 132 and the lower pads 112, a fifth mask process is performed to form a source 250, a drain 252 and a upper pad 254 on the substrate 100. Specifically, the source 250 and the drain 252 respectively contact the first contact region 130a and the second contact region 130b of the channel layer 130, and the drain 252 can extend into the aforementioned opening 120c to contact the substrate 100. At the time, the drain 252 does not directly contact the first electrode layer 132 so as not to electrically connect the first electrode layer 132. In addition, the upper pads 254 are located over the lower pads 112 and contact the lower pads 112 via the first contact openings 246a and the second contact openings 120a. In the embodiment, during forming the upper pads 254, a signal pad 256 can also be formed on the peripheral circuit region pattern 246 of the etching-barrier pattern layer 242.

Figure 2H:
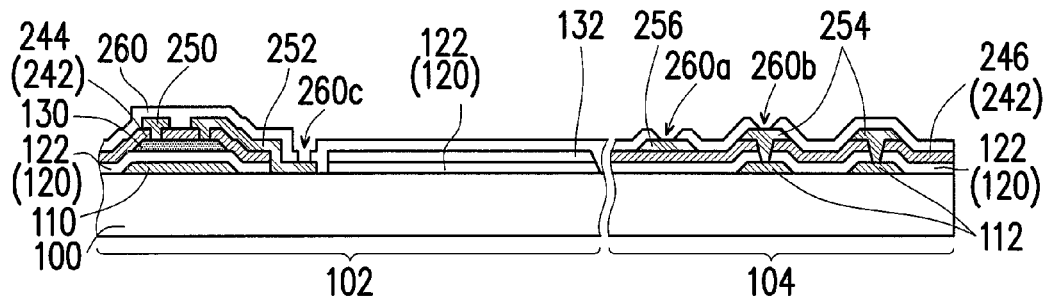

Referring to FIGS. 2G-2H, after finishing the source 250, the drain 252, the upper pads 254 and the signal pad 256, a protective layer 260 is formed on the substrate 100. The protective layer 260 overlays the source 250, the drain 252, the upper pads 254 and the signal pad 256 for the protection purpose. The protective layer 260 extends into the openings 120b and 120c so as to contact and cover the substrate 100 correspondingly to the openings 120b and 120c formed in the gate insulating layer 120. In addition, a sixth mask process is performed to respectively form a third contact opening 260a, a fourth contact opening 260b and form a drain contact opening 260c in the protective layer 260. The third contact opening 260a and the fourth contact opening 260b respectively expose the signal pad 256 and one corresponding upper pad 254, while the drain contact opening 260c exposes the drain 252.

Figure 2I:
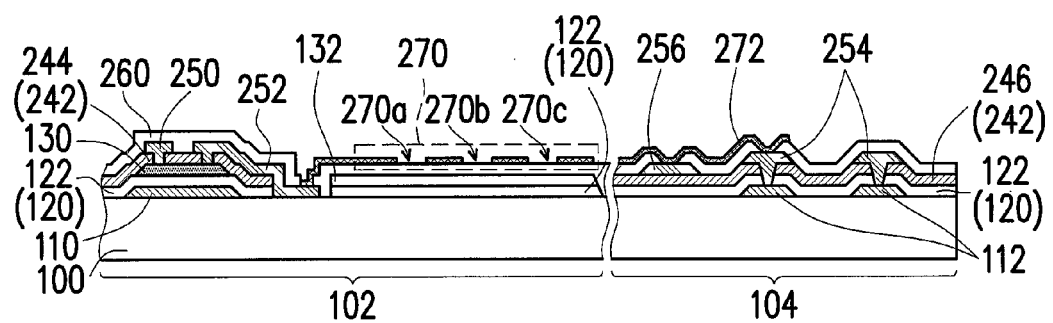

Referring to FIG. 2I, after forming the protective layer 260 on the substrate 100, a seventh mask process is performed to form a second electrode layer 270. The second electrode layer 270 is located in the pixel region 102 and has a plurality of slits 270a, 270b and 270c, and the projection area of the second electrode layer 270 on the substrate 100 and the projection area of the first electrode layer 132 on the substrate 100 are overlapped with each other. By disposing the slits 270a, 270b and 270c, the fringe field can be produced. For example, when the second electrode layer 270 is connected to the drain 252 by setting to receive a corresponding display voltage and the first electrode layer 132 is connected to the common electric-potential, a fringe field is produced at the edges of the slits 270a, 270b and 270c so as to drive the display medium for displaying.

In addition, when the second electrode layer 270 is formed, the second electrode layer 270 can contact the drain 252 via the drain contact opening 260c. In the step of FIG. 2I, a connection electrode 272 can be simultaneously formed.

Referring to FIGS. 2H and 2I, the connection electrode 272 can contact the upper pad 254 and the signal pad 256 via the third contact opening 260a and the fourth contact opening 260b, so that the a pixel structure is formed at the pixel region 102 on the substrate 100, meanwhile, the different conductive layers at the peripheral circuit region 104 on the substrate 100 can be electrically connected to each other. For example, the lower pad 112 and the signal pad 256 can be electrically connected to each other by fabrication.

Figure 3A:
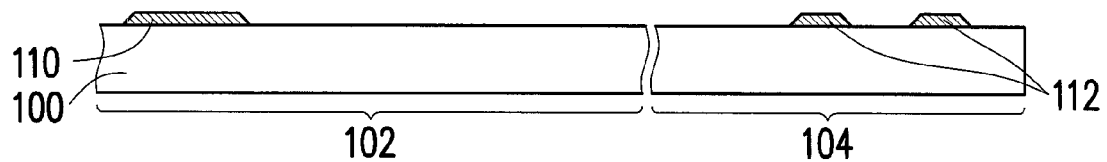
FIGS. 3A through 3I are schematic diagrams of the fabrication flow of a pixel substrate according to the third embodiment of the invention.
Figure 3B:
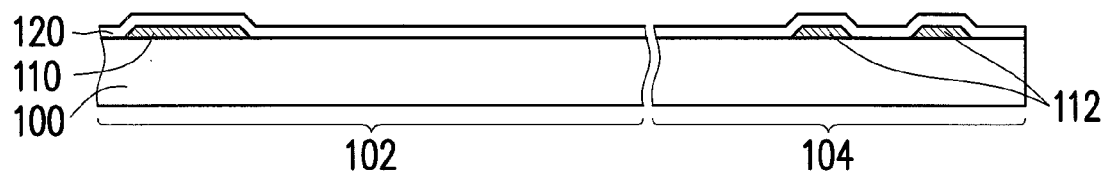
Figure 3C:
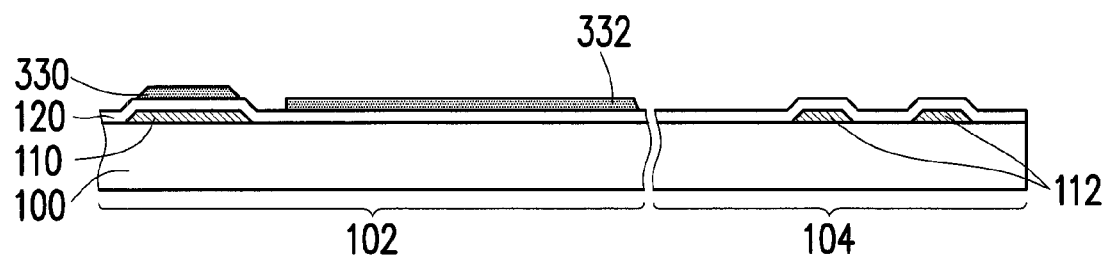
Figure 3D:
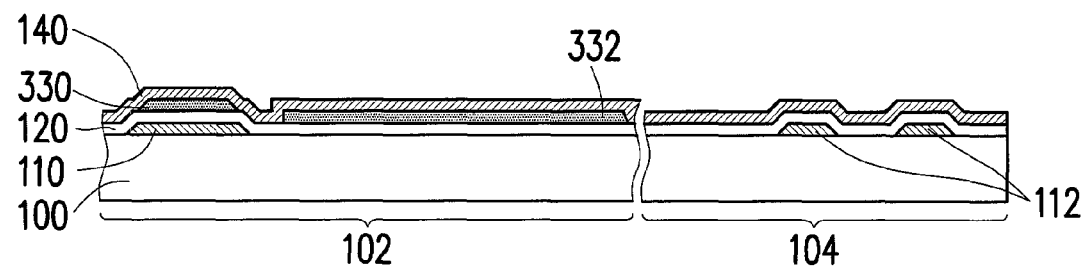
Figure 3E:
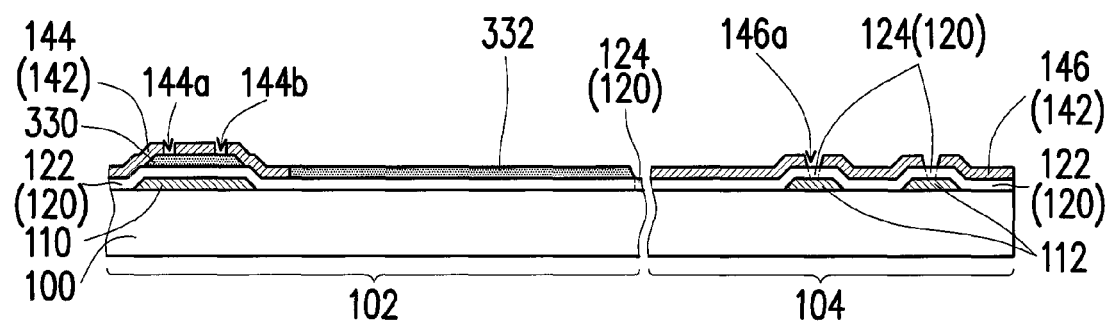

FIGS. 3A through 3I are schematic diagrams of the fabrication flow of a pixel substrate according to the third embodiment of the invention. In the embodiment, the fabrication method of a pixel substrate is similar to the method of aforementioned embodiment, wherein the same portions in the two embodiments are represented in the same notations so as to omit the description thereof. Referring to FIG. 3C, the major difference of the embodiment from the first embodiment lies in that the material of the first electrode layer 332 is the same as the material of the channel layer 330. In more details, as shown in FIG. 3C, since the material of the first electrode layer 332 is the same as the material of the channel layer 330, the second and third mask process in the first embodiment can be combined as one mask process. For example, in the embodiment, the material of the channel layer 330 and the first electrode layer 332 can include oxide semiconductor material, for example, indium-gallium-zinc oxide (IGZO), which the invention is not limited to. The channel layer 330 and the first electrode layer 332 are located in the pixel region 102, and the projection area of the channel layer 330 on the substrate 100 and the projection area of the gate 110 on the substrate 100 are overlapped with each other.

Figure 3F:
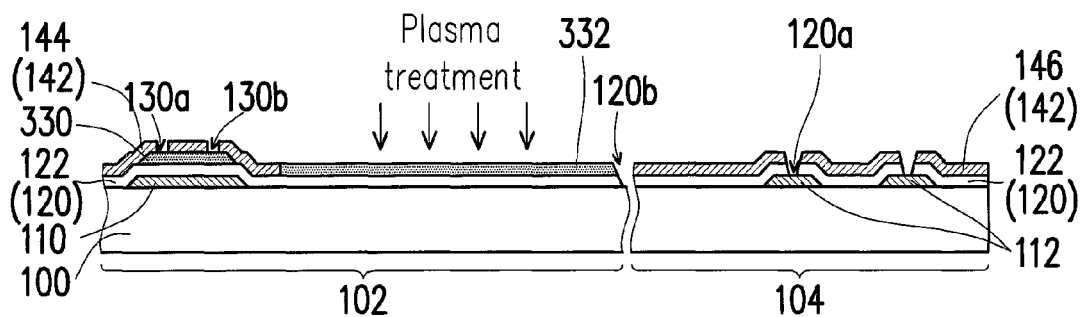
Figure 3G:
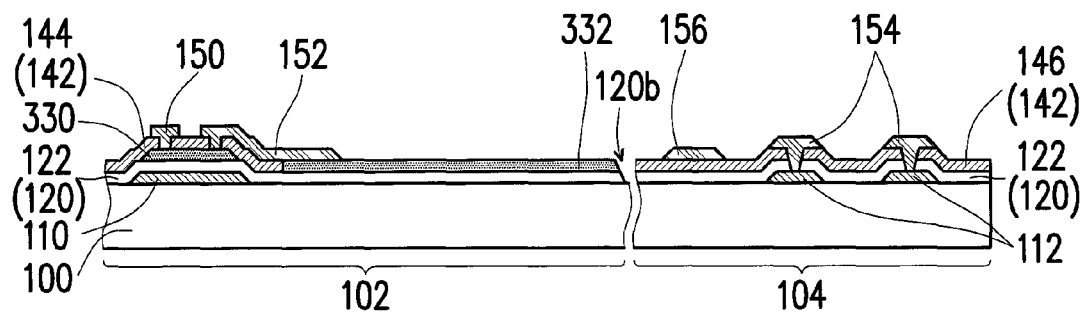
Figure 3H:
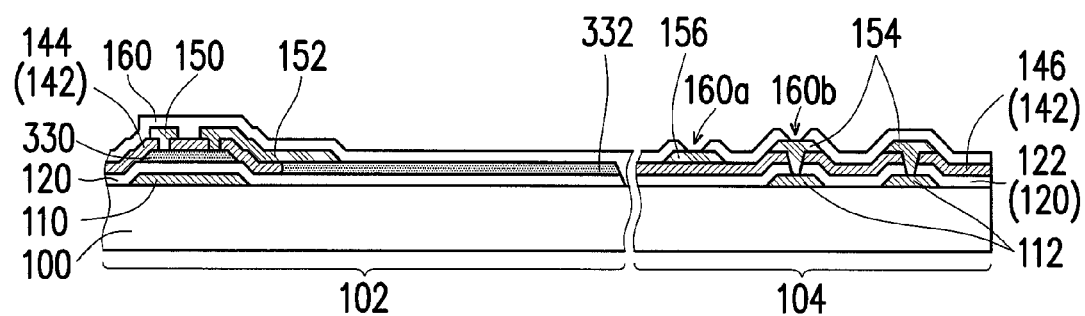
Figure 3I:
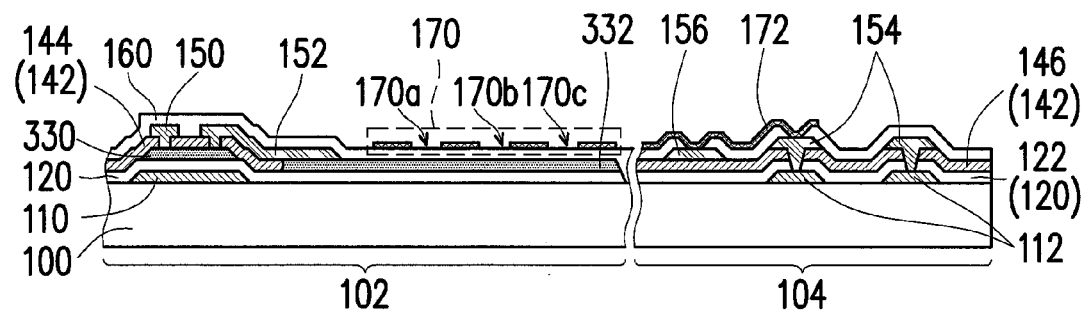

In addition, referring to FIG. 3F, after forming the etching-barrier pattern layer 142. The embodiment further includes performing a modification step on the first electrode layer 332, which includes performing at least one of hydrogen plasma treatment and argon plasma treatment. Thus, the IGZO parts with better conductor performance are formed, i.e., the conductivity of the first electrode layer 332 is greater than the conductivity of the channel layer 330. In addition, the fabrication steps in FIGS. 3G-3I of the embodiment can refer to the fabrication steps in FIGS. 1G-1I of the first embodiment.

Figure 4A:
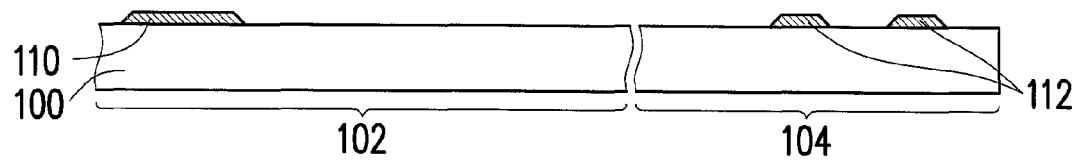
FIGS. 4A through 4I are schematic diagrams of the fabrication flow of a pixel substrate according to the fourth embodiment of the invention.
Figure 4B:
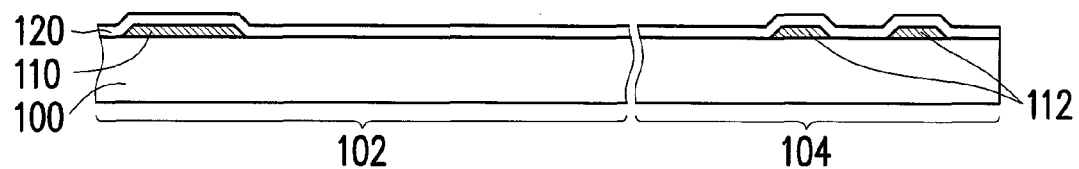
Figure 4C:
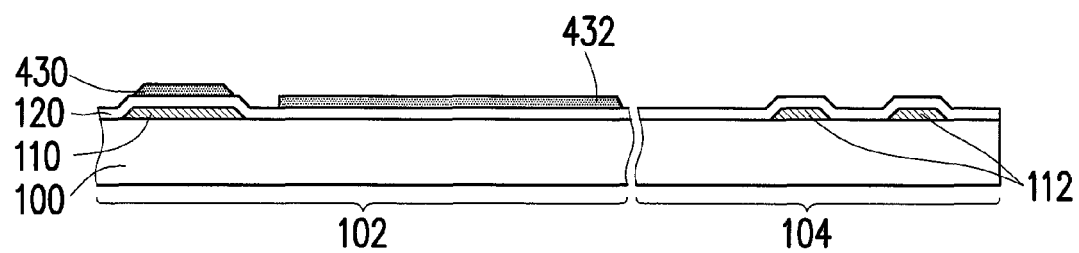
Figure 4D:
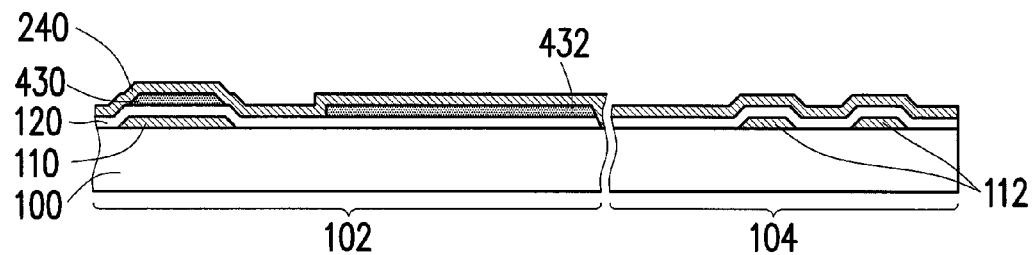
Figure 4E:
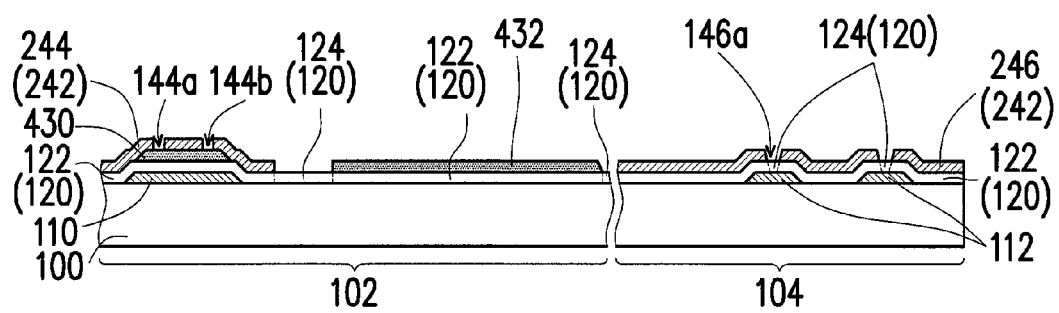

FIGS. 4A through 4I are schematic diagrams of the fabrication flow of a pixel substrate according to the fourth embodiment of the invention. In the embodiment, the fabrication method of a pixel substrate is similar to the aforementioned second embodiment, wherein the same portions in the two embodiments are represented in the same notations so the description thereof is omitted. Referring to FIG. 4C, the major difference of the embodiment from the second embodiment lies in that the material of the first electrode layer 432 is the same as the material of the channel layer 430, so that the second and third mask process in the second embodiment can be combined as one mask process. For example, in the embodiment, the material of the channel layer 430 and the first electrode layer 432 can include oxide semiconductor material, for example, indium-gallium-zinc oxide (IGZO), which the invention is not limited to. The channel layer 430 and the first electrode layer 432 are located in the pixel region 102, and the projection area of the channel layer 430 on the substrate 100 and the projection area of the gate 110 on the substrate 100 are overlapped with each other.

Figure 4F:
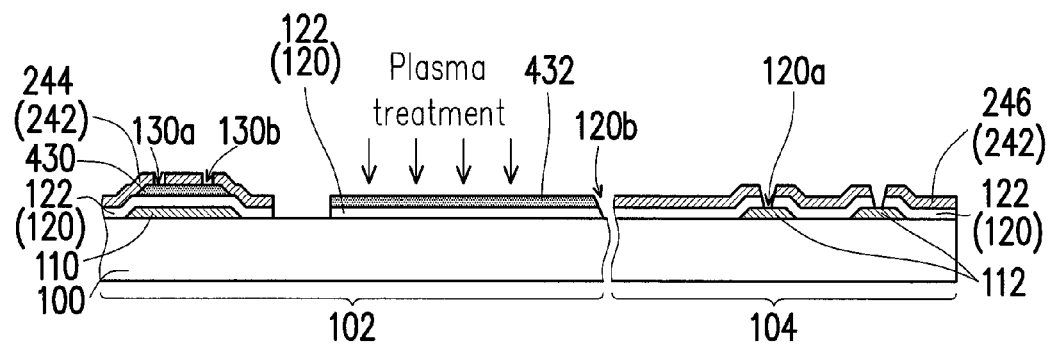
Figure 4G:
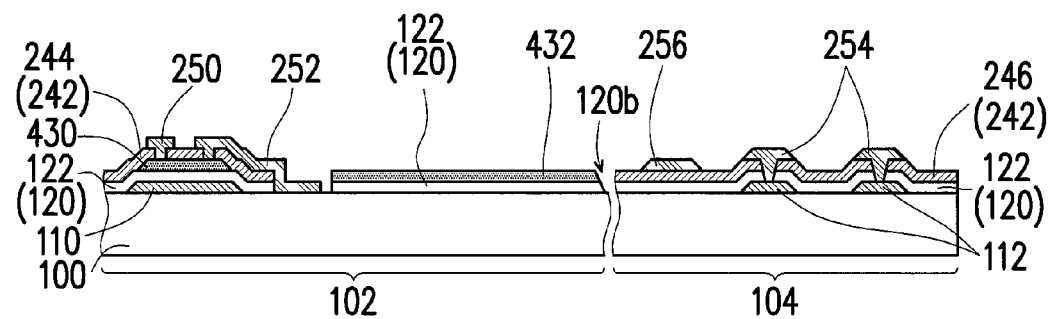
Figure 4H:
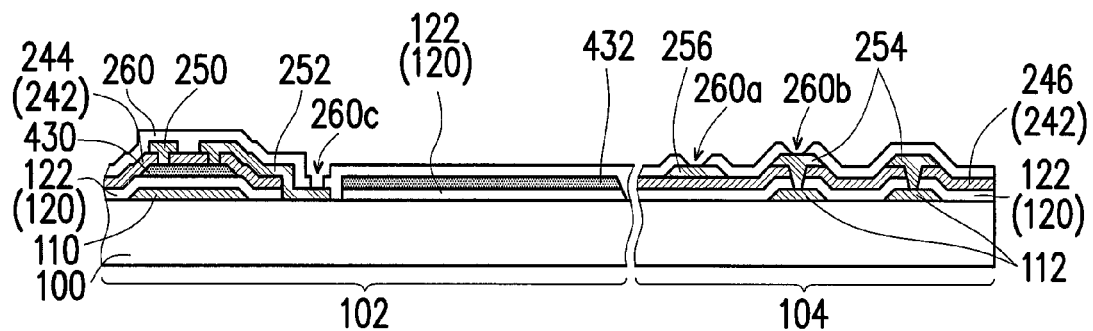
Figure 4I:
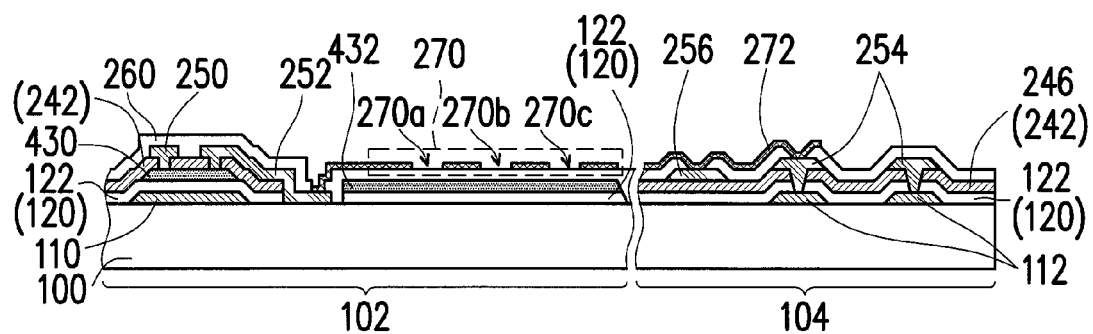

In addition, referring to FIG. 4F, the major difference of the embodiment from the second embodiment rests in that the materials of the first electrode layer 432 and the channel layer 430 are the same as each other, for example, IGZO, which the invention is not limited to. Therefore, after forming the etching-barrier pattern layer 242. The embodiment further includes a modification step performed on the first electrode layer 432. The modification step includes performing at least one of hydrogen plasma treatment and argon plasma treatment. Thus, the IGZO part with enhanced conductivity is formed, i.e., the conductivity of the first electrode layer 432 is greater than the conductivity of the channel layer 430. In addition, the fabrication steps in FIGS. 4G-4I of the embodiment can refer to the fabrication steps in FIGS. 2G-2I of the second embodiment.

In summary, in the fabrication method of a pixel substrate of the embodiment of the invention, after patterning the etching-barrier material layer, the portion of the gate insulating layer not shielded by at least one of the channel layer, the first electrode layer and the etching-barrier pattern layer is removed, i.e., the profile (the opening or the shape) of the etching-barrier material layer and the profile (the opening) of the gate insulating layer are fabricated by using a same patterning step, which can reduce the number of times of performing the patterning processes for fabricating the pixel structure so as to reduce the fabrication time. In addition, according to the invention, the channel layer and the first electrode layer can be made of the same material in association with a modification plasma treatment so as to reduce the number of times of performing the patterning steps for forming the pixel structure and lower down the fabrication cost. By the modification treatment, the IGZO part of the first electrode layer is modified to have good conductor performance so that the conductivity of the first electrode layer is greater than the conductivity of the channel layer. In addition, the fabrication method of a pixel substrate provided by the invention can be used to fabricate a pixel substrate in an efficient way.

It should be noted that the aforementioned embodiments are used for the purpose of description and should not be regarded as limiting. Although the invention is depicted by referring to the embodiments, but it will be apparent to those skilled in the art that various modifications or partial/whole equivalent replacement according to the schemes of the embodiments can be made, and such modifications or partial/whole equivalent replacement are allowed without departing from the scope or spirit of the invention.

What is claimed is:
1. A fabrication method of a pixel substrate, comprising:
forming a channel layer and a first electrode layer on an insulating layer,
wherein both the channel layer and the first electrode layer are located in a pixel region of a substrate;
forming an etching-barrier material layer on the substrate to entirely overlay the channel layer, the first electrode layer and the insulating layer;
performing an etching step for patterning the etching-barrier material layer to form an etching-barrier pattern layer having a first contact opening exposing a non-shielded portion of the insulating layer,
wherein subsequent to forming the etching-barrier pattern layer, the etching step further removes the non-shielded portion of the insulating layer to form a second contact opening at the insulating layer;
forming a source, a drain and an upper pad;
forming a protective layer on the substrate to overlay the source, the drain and the upper pad; and
forming a second electrode layer on the protective layer, wherein the second electrode layer is located in the pixel region and has a plurality of slits, and a first projection area of the first electrode layer on the substrate and a second projection area of the second electrode layer on the substrate are overlapped with each other.

2. The fabrication method of a pixel substrate as claimed in claim 1, wherein during forming the etching-barrier pattern layer, a pixel region pattern of the etching barrier pattern layer is formed in the pixel region and the pixel region pattern has a first channel contact opening and a second channel contact opening for exposing the channel layer.

3. The fabrication method of a pixel substrate as claimed in claim 1, further comprising forming a gate in the pixel region of the substrate, wherein the insulating layer overlays the gate as a gate insulating layer.

4. The fabrication method of a pixel substrate as claimed in claim 1, further comprising forming a lower pad on a peripheral circuit region of the substrate, wherein the second contacting opening at the insulating layer exposes the lower pad and the upper pad contacts the lower pad via the first contact opening and the second contact opening.

5. The fabrication method of a pixel substrate as claimed in claim 1, wherein the source and the drain are formed in a manner of contacting the channel layer.

6. The fabrication method of a pixel substrate as claimed in claim 1, further performing a plasma treatment on the first electrode layer subsequent to the forming of the first electrode layer.

7. The fabrication method of a pixel substrate as claimed in claim 6, wherein the plasma treatment comprises at least one of hydrogen plasma treatment and argon plasma treatment.

8. A pixel substrate, comprising:
   a channel layer, disposed on an insulating layer and located at a pixel region of a substrate;
   a first electrode layer, located in the pixel region;
   an etching-barrier pattern layer, comprising a pixel region pattern and a peripheral circuit region pattern,
   wherein the pixel region pattern exposes a first contact region and a second contact region of the channel layer, and the peripheral circuit region pattern has a first contact opening located at a peripheral circuit region of the substrate, and
   wherein the insulating layer comprises a second contact opening, and the second contact opening and the first contact opening together form a continuous space;
   a source;
   a drain;
   an upper pad, filled in the first contact opening and the second contact opening; and
   a second electrode layer, located in the pixel region and having a plurality of slits,
   wherein a first projection area of the first electrode layer on the substrate and a second projection area of the second electrode layer on the substrate are overlapped with each other.

9. The pixel substrate as claimed in claim 8, wherein a material of the channel layer comprises oxide semiconductor layer.

10. The pixel substrate as claimed in claim 9, wherein a material of the first electrode layer comprises metal oxide.

11. The pixel substrate as claimed in claim 10, wherein the material of the first electrode layer is the same as the material of the channel layer.

12. The pixel substrate as claimed in claim 8, wherein the pixel region pattern has a first channel contact opening and a second channel contact opening, the first channel contact opening exposes the first contact region of the channel layer and the second channel contact opening exposes the second contact region of the channel layer.

13. The pixel substrate as claimed in claim 8, wherein the pixel region pattern overlays the area of the channel layer excluding the first contact region and the second contact region.

14. The pixel substrate as claimed in claim 8, further comprising a gate disposed on the pixel region of the substrate, wherein the insulating layer overlays the gate as a gate insulating layer.

15. The pixel substrate as claimed in claim 8, further comprising a lower pad disposed on the peripheral circuit region of the substrate, wherein the second contact opening at the insulating layer exposes the lower pad, the first contact opening in the etching-barrier layer is located over the lower pad and the upper pad contacts the lower pad via the first contact opening and the second contact opening.

16. The pixel substrate as claimed in claim 8, wherein a material of the etching barrier pattern layer comprises silicon oxide.

17. The pixel substrate as claimed in claim 8, further comprising a protective layer located between the first electrode layer and the second electrode layer and further comprising a signal pad on the etching barrier pattern layer.

18. The pixel substrate as claimed in claim 17, further comprising a connection electrode on the protective layer, wherein the protective layer has a third contact opening exposing the signal pad and a fourth contacting opening exposing the upper pad, and the connection electrode contacts the signal pad and the upper pad via the third contact opening and the fourth contact opening.

19. The pixel substrate as claimed in claim 8, wherein the source and the drain contact the channel layer.

20. The pixel substrate as claimed in claim 8, wherein one of the first electrode layer and the second electrode layer is electrically connected to the drain.

* * * * *